United States Patent
Anvari

(10) Patent No.: US 8,779,851 B2
(45) Date of Patent: Jul. 15, 2014

(54) LINEARIZING A POWER AMPLIFIER

(75) Inventor: Kiomars Anvari, Alamo, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 171 days.

(21) Appl. No.: 13/471,933

(22) Filed: May 15, 2012

(65) Prior Publication Data

US 2013/0307618 A1    Nov. 21, 2013

(51) Int. Cl.
*H03F 1/26* (2006.01)
(52) U.S. Cl.
USPC ........... 330/149; 330/136; 375/297; 375/296; 455/126; 455/63.1
(58) Field of Classification Search
USPC ........... 330/149, 136; 375/297, 296; 455/126, 455/63.1
See application file for complete search history.

(56) References Cited

U.S. PATENT DOCUMENTS

| | | | | |
|---|---|---|---|---|
| 6,566,948 B1 * | 5/2003 | Braithwaite | .................. | 330/149 |
| 6,853,246 B2 * | 2/2005 | Bauder et al. | ................. | 330/149 |
| 6,934,341 B2 * | 8/2005 | Sahlman | ........................ | 375/297 |
| 7,151,405 B2 * | 12/2006 | Nezami | ......................... | 330/149 |
| 7,274,255 B2 * | 9/2007 | Hellberg | ........................ | 330/136 |
| 8,314,656 B2 * | 11/2012 | Ohkawara et al. | ............ | 330/149 |
| 8,611,459 B2 * | 12/2013 | McCallister | .................. | 375/296 |
| 2010/0039174 A1 * | 2/2010 | Teetzel | .......................... | 330/149 |

* cited by examiner

*Primary Examiner* — Patricia Nguyen
(74) *Attorney, Agent, or Firm* — Wagner Blecher

(57) ABSTRACT

A circuit for linearizing a power amplifier. The circuit includes a main signal path comprising a digital-to-analog converter, wherein a main signal is transmitted through the main signal path to said power amplifier; and a digital pre-distortion path disposed outside of the main signal path, wherein the digital pre-distortion path includes a digital pre-distorter for digitally pre-distorting the main signal.

19 Claims, 10 Drawing Sheets

LINEARIZING A POWER AMPLIFIER

BACKGROUND

Power amplifiers are non-linear devices that cause distortion to the amplified signal. An amplifier maintains a constant gain (the ratio of output to input power or amplitude) for low-level input signals. However, at higher input levels, the amplifier goes into saturation and its gain decreases. Moreover, signal distortion increases during saturation.

The power amplifiers may be operated at a constant gain (or linear portion) to reduce distortion. However, the operation in the linear portion of the amplifier does not allow the amplifier to amplify the input signal to its full potential. Moreover, operation of the amplifier in the linear portion utilizes high levels of energy.

Linearization of the power amplifier is often utilized to overcome the non-linearity of the power amplifier. Linearization may accomplished by various digital pre-distortion techniques. However, conventional methods of digital pre-distortion are limited by the bandwidth of the input signal. For instance, electrical components (e.g., Analog-to-Digital converters (ADCs)) that facilitate in the digital pre-distortion are only able process signals up to a maximum bandwidth. Accordingly, the linearization and signal amplification is negatively affected when the signal bandwidth (including distortion) is greater than the maximum bandwidth.

The drawings referred to in this description should be understood as not being drawn to scale except if specifically noted.

DESCRIPTION OF EMBODIMENTS

Reference will now be made in detail to embodiments of the present technology, examples of which are illustrated in the accompanying drawings. While the technology will be described in conjunction with various embodiment(s), it will be understood that they are not intended to limit the present technology to these embodiments. On the contrary, the present technology is intended to cover alternatives, modifications and equivalents, which may be included within the spirit and scope of the various embodiments as defined by the appended claims.

Furthermore, in the following description of embodiments, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the present embodiments.

Figure 1:
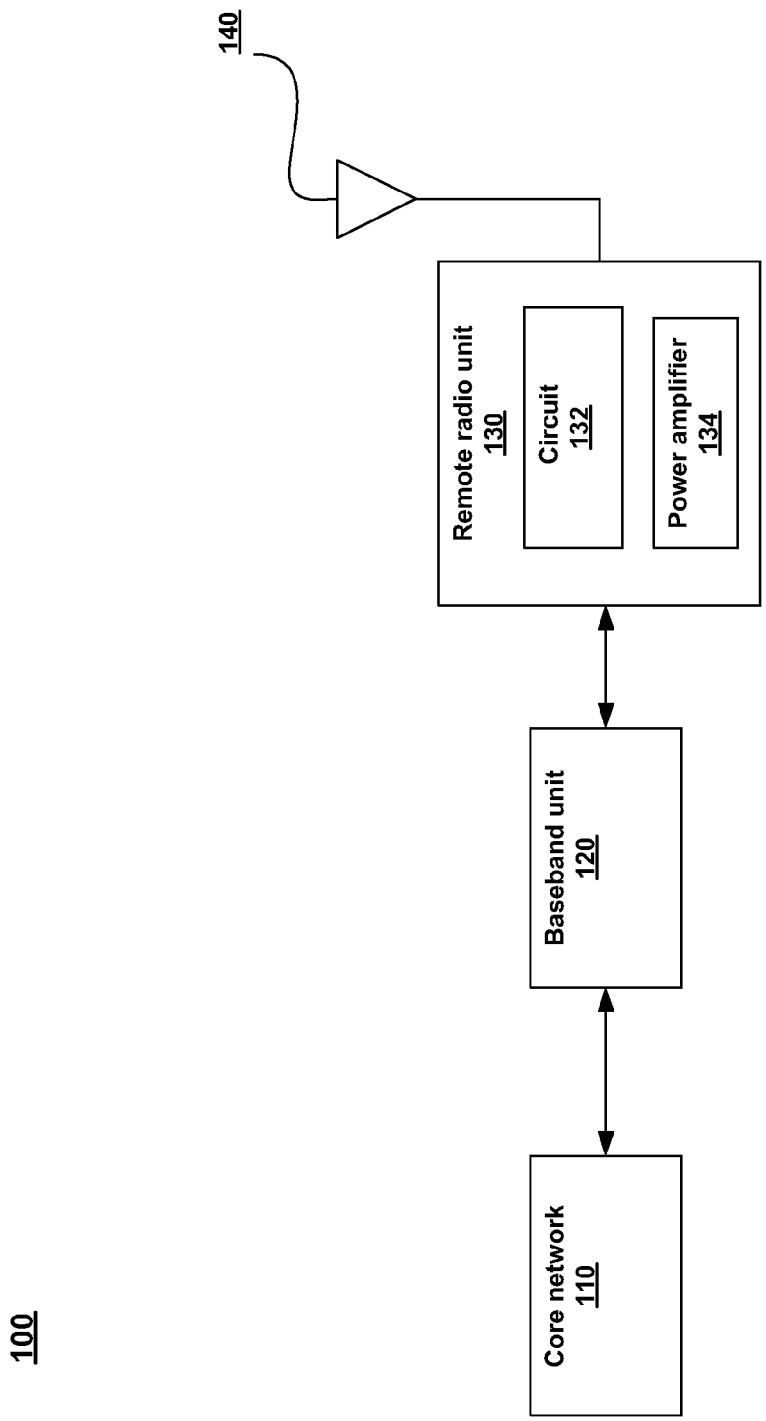
FIG. 1 illustrates an embodiment of a wireless network.

FIG. 1 depicts an embodiment of wireless network 100. In general, wireless network 100 facilitates in the providing of services, by a service provider, to subscribers of the service provider. For example, subscribers request services from the service provider. In response to the request, the service provider provides the requested services to the users via wireless network 100. In various embodiments, the service provider provides services such, as but not limited to, telecommunication services, web base services (e.g., movies, banking, shopping, voice over IP (VOIP) etc.).

In general, communication signals are transmitted through wireless network 100 by way of, but not limited to, core network 110, baseband unit 120, remote radio unit 130 and antenna 140. For instance, a signal is received by core network 110 and transmitted to remote radio unit 130, via baseband unit 120. The signal is amplified by power amplifier 134, located in circuit 132, before being transmitted via antenna 140.

Circuit 132 can be, but is not limited to, an integrated circuit, a System on a Chip (SOC). It should be appreciated that any combination of circuits, integrated circuits and/or electrical components can make up circuit 132.

Core network 110 also has a variety of functions, such as, but not limited to, authentication, authorization, accounting, tracking packets, client mobility management, etc. In general, core network 110 provides various services to customers who are connected by the access network. Moreover, core network 110 is a high capacity communication facility that connects primary nodes. Also, core network 110 provides paths for the exchange of information between different sub-networks.

In various embodiments, baseband unit 120 is a base station for processing communications from subscribers to the service provider and vice versa via antenna 140. Baseband unit 120 typically utilizes appropriate communications software and hardware to properly process the communications. In one embodiment, the base station is a small or micro base station. In another embodiment, the base station is a macro base station. The base station may be a single unit or may be distributed.

In general, remote radio unit 130 or remote radio head is often utilized in the context of distributed base stations. Remote radio unit 130 includes the base station's radio frequency (RF) circuitry plus analog-to-digital/digital-to-analog converters and up/down converters, among other things. In various embodiments, remote radio unit 130 includes operation and management processing capabilities and a standardized optical interface to connect to the rest of the base station. The Common Public Radio Interface (CPRI) standard defines the interface between base stations and radio equipment, such as the remote radio unit 130. It should be understood that remote radio unit 130 may be local to the base station or may be remote to the base station.

Antenna 140 can be any antenna that is able to wirelessly transmit/receive communication signals, such as data packets. Antenna 140 is disposed on any physical platform that is conducive to effectively transmit/receive the signals. For example, antenna 140 is disposed on a tower. It should be appreciated that many antennas may be disposed on the tower.

In various embodiments, communications signals of wireless network 100 are transmitted through a metro/access transport network. The metro/access transport network can be, but is not limited to, a Gigabit Ethernet network, or a 10-Gigabit Ethernet metropolitan access network. In general, a metro/access transport network is a transport network that covers a metropolitan area and based on the Ethernet standard. It is commonly used as a metropolitan access network to connect subscribers and businesses to a larger service network or the Internet.

As described above, power amplifier 134 is a non-linear device. That is, at higher input levels, the amplifier becomes saturated and its gain decreases. Additionally, signal distortion increases during saturation. As a result, power amplifier 134 introduces in-band and out-of-band distortion to the communication signal.

However, linearization of the power amplifier may be utilized to linearize the output of power amplifier 134. Linearization or linearizing, as used herein, refers to applying a non-linear transformation to the signal (that is received by the power amplifier) wherein the non-linear transformation opposes the subsequent non-linearity of the power amplifier.

Circuit 132 provides features and functionality for linearization of power amplifier 134. The discussion below will describe the features and functionality of various embodiments regarding the linearization of power amplifiers accomplished by utilizing digital pre-distortion techniques.

Circuit 132, as depicted in FIG. 1, is located at remote radio unit 130 of wireless network 100. However, circuit 132 may be located at any location such that it provides linearization of power amplifier 134. For example, circuit 132 may be located in a hand-held device (e.g., cell phone), a micro or macro base station, satellite, etc.

Figure 2:
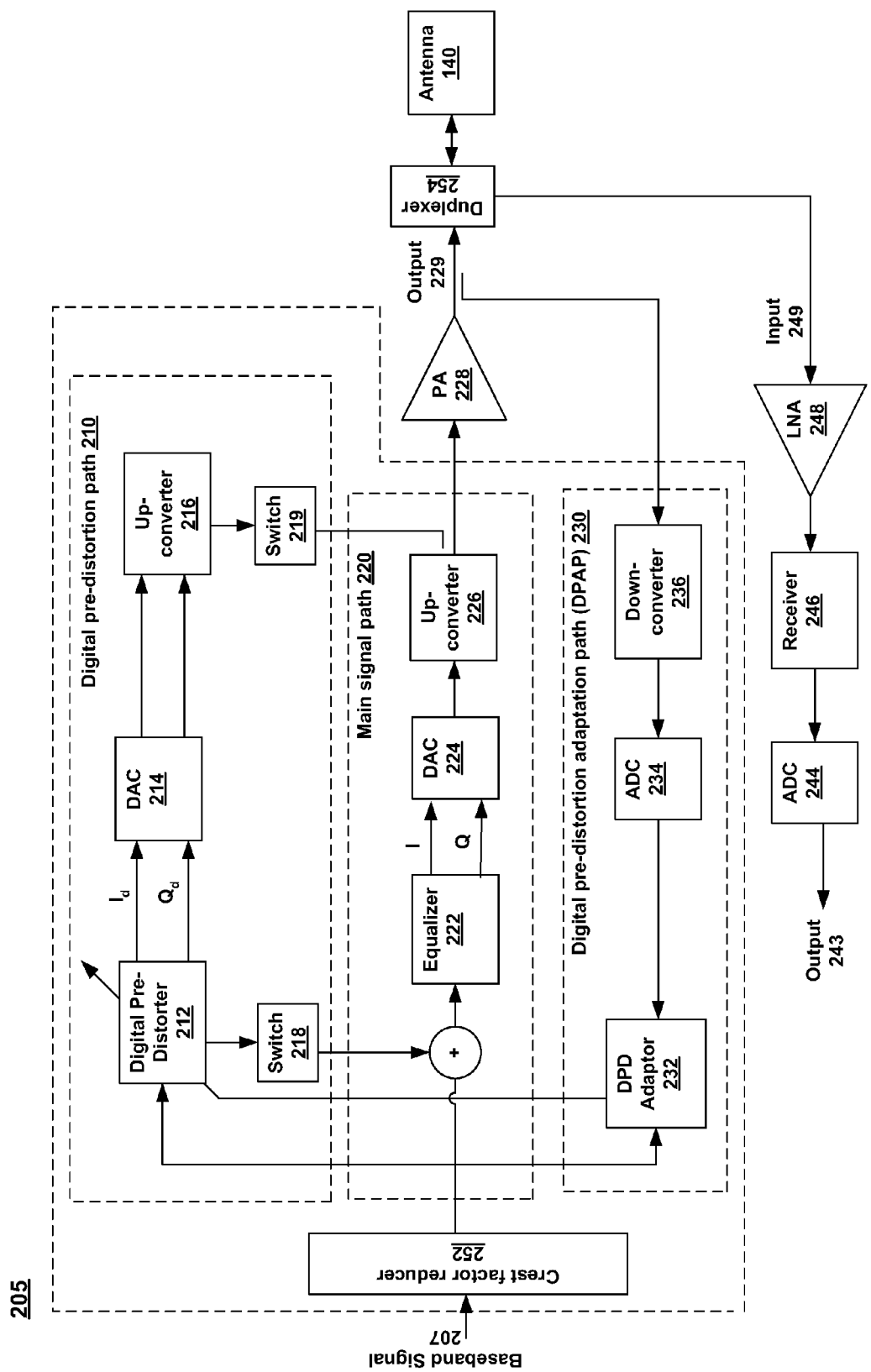
FIGS. 2-9 illustrates embodiments of a circuit.

FIG. 2 depicts an embodiment of wireless network 100. In particular, FIG. 2 depicts an embodiment of circuit 205 for linearizing power amplifier 228. Circuit 205 and power amplifier 228 are similar to circuit 132 and power amplifier 134, respectively, as described above.

Circuit 205 includes, among other things, digital pre-distortion path 210, main signal path 220, and digital pre-distortion adaptation path (DPAP) 230 for facilitating in the linearization of power amplifier 228, which is described in further detail below.

During use, baseband signal 207 is received by circuit 205. In one embodiment, baseband signal 207 is received by crest factor reducer 252 which reduces the Peak-To-Average-Power-Ratio (PAPR) of baseband signal 207. Crest factor or PAPR is a measurement of a waveform, calculated from the peak amplitude of the waveform divided by the root mean square (RMS) value of the waveform. In other words, crest factor reducer 252 reduces high peaks in the baseband signal by clipping baseband signal 207.

In various embodiments, baseband signal 207 bypasses crest factor reducer 252 and is received by equalizer 222.

Baseband signal 207, which is also referred to as the main signal, is passed through main signal path 220 and amplified by power amplifier 228. It is noted that baseband signal 207 comprises quadrature IQ signals. Main signal path 220 includes equalizer 222, DAC 224 and up-converter 226.

Baseband signal 207 is initially a digital signal and is received by equalizer 222. Equalizer 222 is for performing equalization or calibration of baseband signal 207. The output of equalizer 222 is received by DAC 224.

DAC 224 converts the received digital signal into an analog signal. The analog signal is then up-converted by up-converter 226. In particular, baseband signal 207 is converted into an analog signal and subsequently up-converted by up-converter 226.

The analog up-converted baseband signal in main signal path 220 is combined with the output of digital pre-distortion path 210 prior to being amplified by power amplifier 228.

Pre-distortion of baseband signal 207 is not performed in the main signal path 220. Rather, pre-distortion of baseband signal 207 is performed in digital pre-distortion path 210, which will be described in detail below. Additionally, pre-distortion of a signal increases the bandwidth of the signal.

Accordingly, the signal bandwidth of baseband signal 207 that is passed through main signal path 220 does not include distortion and therefore, the bandwidth of baseband signal 207 includes only the original signal bandwidth. Therefore, DAC 224 is a high dynamic range/low bandwidth DAC because baseband signal 207 (which passes through main signal path 220) is a high dynamic range/low bandwidth signal which does not include additional bandwidth caused by pre-distortion.

Moreover, DAC 224 may be a lower bandwidth and/or lower dynamic range DAC (e.g., a more relaxed resolution and specification), as compared to a traditional or conventional DAC that is required to process a baseband signal including additional pre-distortion bandwidth. For instance, in a conventional method, any components in the circuit between the digital domain and the power amplifier (e.g., DAC, up-converter) are required to be high (or wide) bandwidth components. As a result, the high bandwidth components are required to have a higher sampling rate, among other things, which increases power consumption and cost.

It should be appreciated that a conventional DAC may be required to process baseband signals having a bandwidth of around 25 kHz to 30 kHz. However, current wireless network technology includes signal bandwidth in the range of about 150 MHz. Accordingly, conventional DACs (or other components) are not able to properly process the 150 MHz signal bandwidth.

In one embodiment, the resolution (or dynamic range) of DAC 224 is reduced by 2 bits with respect to a conventional DAC that is required to process a baseband signal including additional distortion bandwidth. It should be appreciated that DAC 224 is able to process a baseband signal in the range of 150 MHz.

Baseband signal 207 is also received by digital pre-distortion path 210. In particular, digital pre-distortion path 210 is disposed outside of main signal path 220. Digital pre-distortion path 210 includes digital pre-distorter 212, DAC 214, up-converter 216, switch 218 and switch 219.

Baseband signal 207 is also received by digital pre-distorter 212 which digitally pre-distorts baseband signal 207. As such, the pre-distortion of baseband signal 207 is provided in the digital domain.

The output of digital pre-distorter 212 includes only the distortion of baseband signal 207. That is, the output of digital pre-distorter 212 (i.e., quadrature signals $I_d$ and $Q_d$) includes the distortion bandwidth of baseband signal 207 but does not include the original baseband signal bandwidth. Therefore, the output of digital pre-distorter 212 is a high (or wide) bandwidth/low dynamic range signal.

DAC 214 is a low dynamic range/high bandwidth DAC because it converts the high bandwidth/low dynamic range signal from digital pre-distorter 212. In particular, DAC 214 converts the received digital signal into an analog signal, which is then up-converted by up-converter 216.

Moreover, DAC 214 may be a lower resolution (or lower dynamic range) DAC, as compared to a traditional or conventional DAC that is required to process a baseband signal including additional distortion bandwidth. For instance, in a conventional method, a DAC is required to process the high bandwidth/high dynamic range baseband signal. However, DAC 214 is required only to process a low dynamic range signal. In one embodiment, DAC 214 is a 10-bit DAC that is able to clock at higher frequency.

As described above, the analog output of up-converter 216 is combined or added to the output of up-converter 226 of main signal path 220 prior to power amplifier 228 via switch 219. As a result, pre-distortion is activated in the analog domain via switch 219.

In one embodiment, the pre-distortion is activated in the digital domain. For example, the output of pre-distorter 212 is added to main signal path 220 via switch 218, prior to equalizer 222. This is done if there is a low bandwidth and it is not ideal to apply the pre-distortion in the analog domain.

In various embodiments, the output of digital pre-distortion path is in the RF spectrum or the intermediate frequency (IF) spectrum.

Output 229 of power amplifier 228 is received by DPAP 230, which is a feedback loop. For example, a sample or an attenuated output of power amplifier 228 is received by DPAP 230. DPAP 230 includes digital pre-distortion adaptor 232, analog-to-digital converter (ADC) 234, and down-converter 236.

In particular, output 229 is down-converted by down-converter 236. The analog output of down-converter 236 is converted to a digital signal via ADC 234. It should be appreciated that under-sampling based on limiting the bandwidth in the analog domain or aliasing in the digital domain occurs at ADC 234 in the feedback or adaptation path.

The digital output of ADC 234 and the baseband signal 207 (e.g., crest factor reduced or not crest factor reduced) are received by digital pre-distortion adaptor 232. Then digital pre-distortion adaptor 232 provides digital pre-distortion adaptation for digital pre-distorter 212. In other words, digital pre-distortion adaptation is provided in the digital domain and is based on a baseband signal 207 and an output of ADC 234.

For instance, distortion of power amplifier 228 is determined by the feedback. As such, digital pre-distorter 212 is able to adapt or adjust the pre-distortion of baseband signal 207 based on the distortion of power amplifier 228.

More specifically, digital pre-distortion adaptor 232 calculates the error signal (e.g., the difference) between the feedback signal at the output of the ADC 234 and main baseband signal. The output of digital pre-distortion adaptor 232 is pre-distortion coefficients (e.g., higher order and lower order coefficients) received and used by digital pre-distorter 212. The pre-distortion coefficients adjust the digital pre-distortion provided by digital pre-distorter 212. As a result, the error signal between the output of ADC 234 and the main baseband signal is minimized.

In one embodiment, circuit 205 is utilized with components for receiver signal processing, such as, ADC 244, receiver 246, and low-noise amplifier (LNA) 248. For example, input 249 (an RF signal) is received at duplexer 254 from antenna 140. Input 249 is processed by LNA 248, receiver 246 and digitally converted by ADC 244 as output 243. Output 243 is a digital signal that is transmitted to another node or destination within wireless network 100.

In another embodiment, circuit 205 includes an oscillator (not shown). In general, the oscillator is in down converter 236 for down converting the feedback signal and in up converters 226 and 216 for up converting the main signal and distortion signal.

Figure 3:
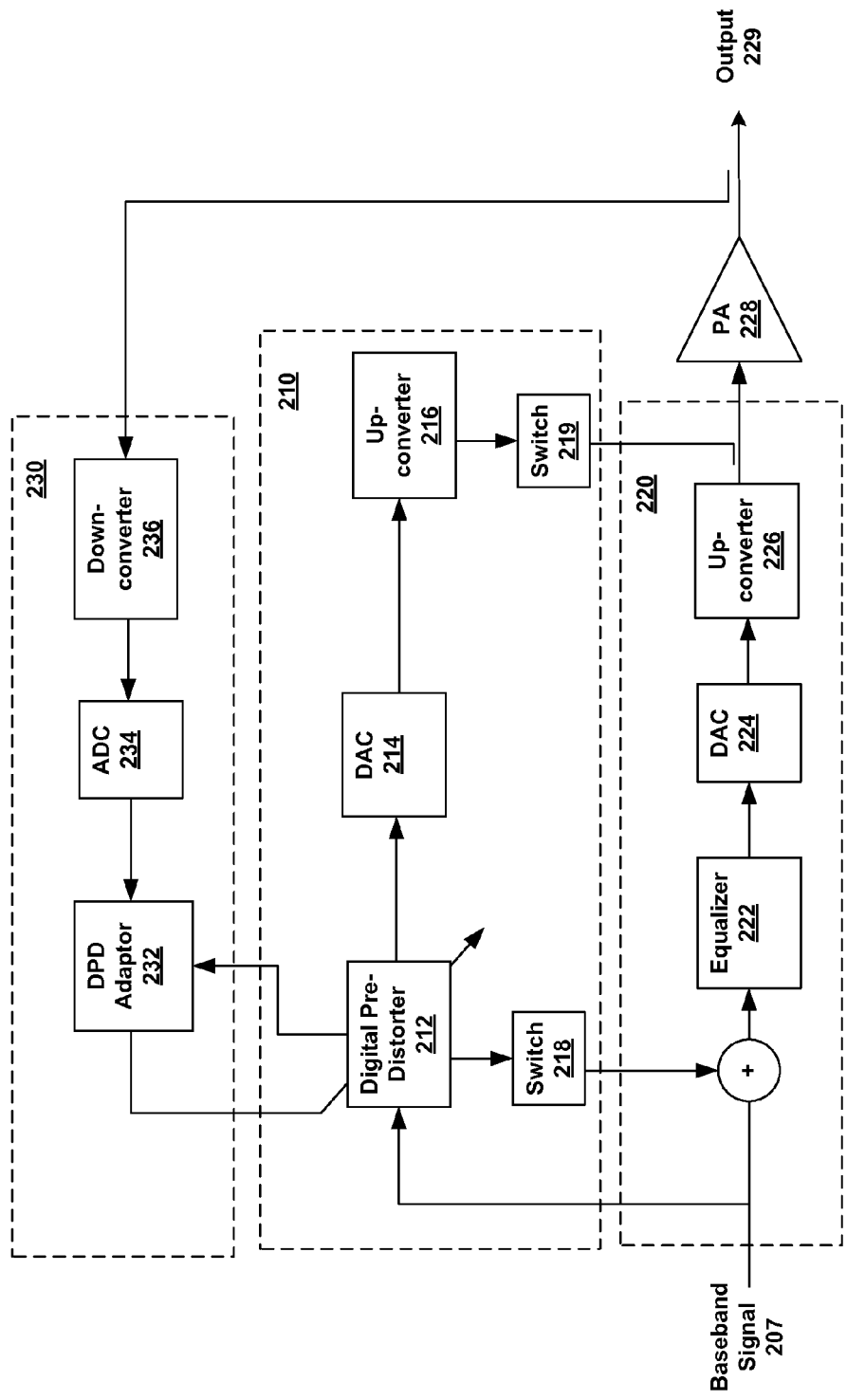

FIG. 3 depicts an embodiment of circuit 305. Circuit 305 is similar to circuit 205, as described above. For example, circuit 305 includes the same features and functionality of circuit 205. However, digital pre-distortion adaptor 232 receives and compares the output of ADC 234 and the pre-distortion signal from digital pre-distorter 212 for adaptation.

Figure 4:
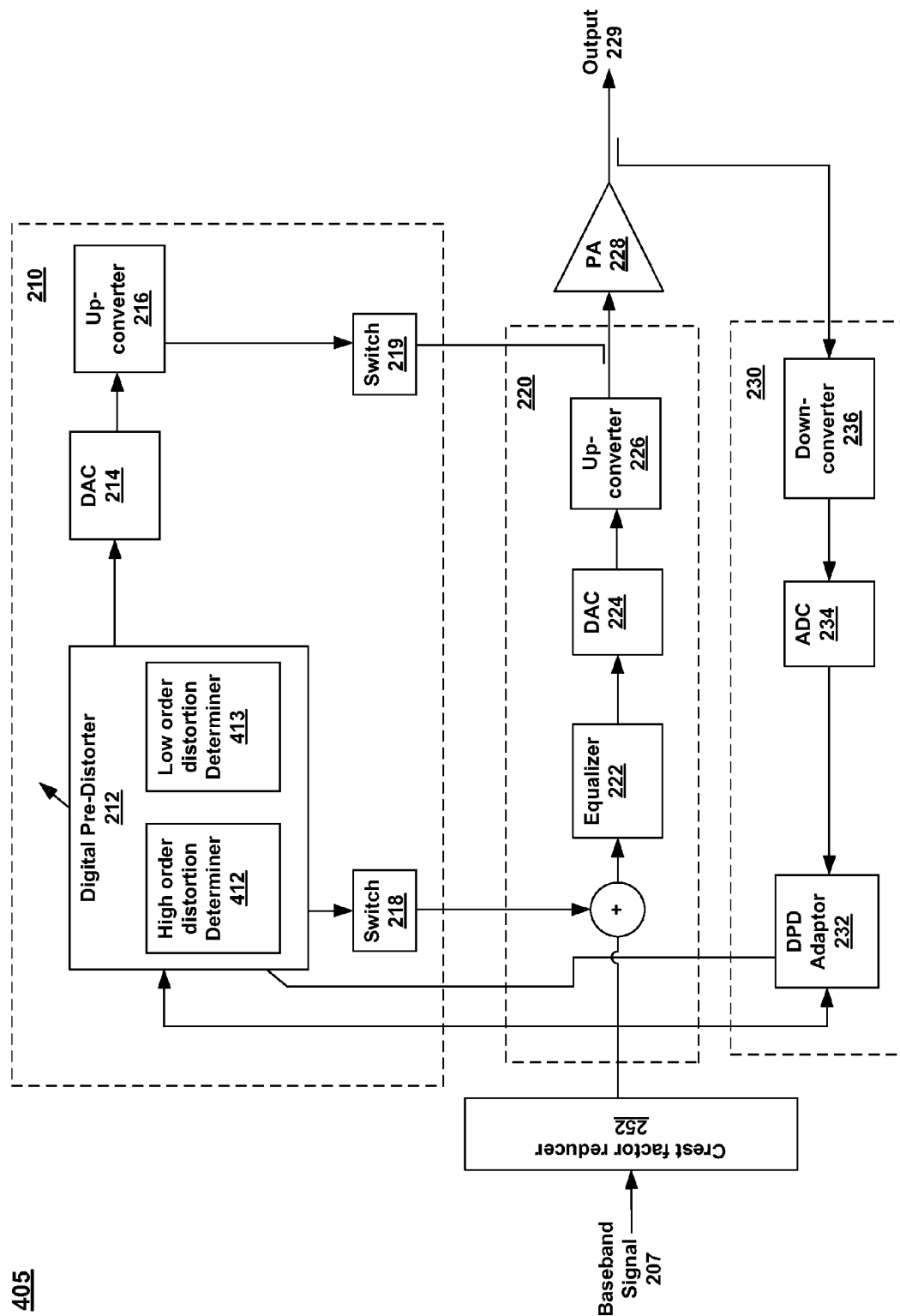

FIG. 4 depicts an embodiment of circuit 405. Circuit 405 is similar to at least circuit 205, as described above. For example, circuit 405 includes the same features and functionality of circuit 205. However, digital pre-distorter 212 includes high order distortion determiner 412 and low order distortion determiner 413.

The pre-distortion is divided into higher order (distortion signals further away from main signal) and lower order (distortion signals closer to the main signal). In particular, high order distortion determiner 412 determines the high order distortion and low order distortion determiner 413 determines the lower order distortion.

After the high and low order distortions are determined, the high order distortions are added in the analog domain of digital pre-distortion path 210 and the low order distortions are added to the digital domain of main signal path 220. For example, the high order distortions are up-converted via up-converter 216 to IF or RF frequency before being added to main signal path 220 prior to power amplifier 228.

Additionally, the adaptation is done in the digital domain using the feedback signal and the output of crest factor reducer 252.

Figure 5:
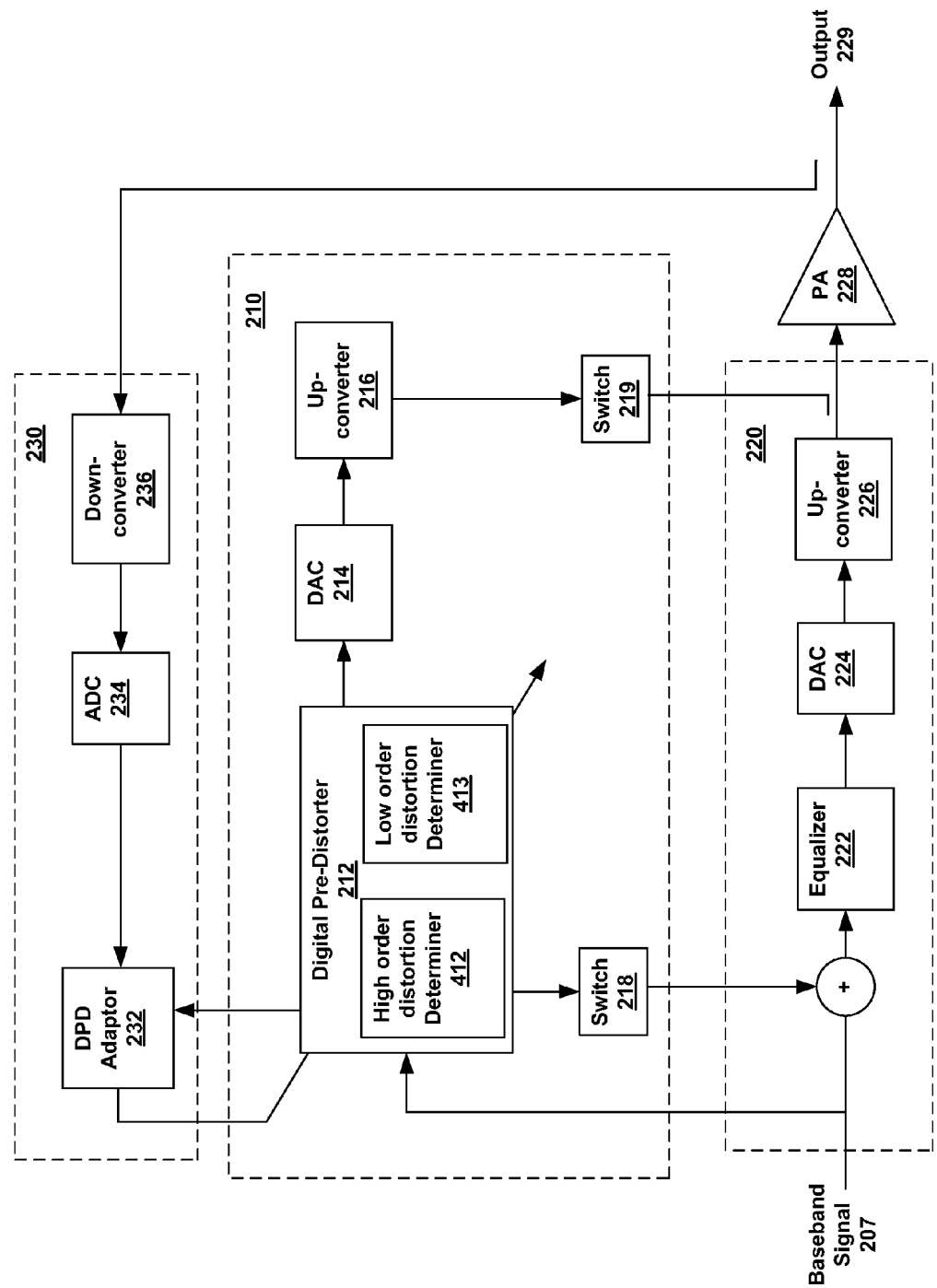

FIG. 5 depicts an embodiment of circuit 505. Circuit 505 is similar to at least circuit 405, as described above. For example, circuit 505 includes the same features and functionality of circuit 205, such as, high order distortion determiner 412 and low order distortion determiner 413. However, digital pre-distortion adaptor 232 receives and compares the output of ADC 234 and the pre-distorted signal from digital pre-distorter 212 for adaptation.

Figure 6:
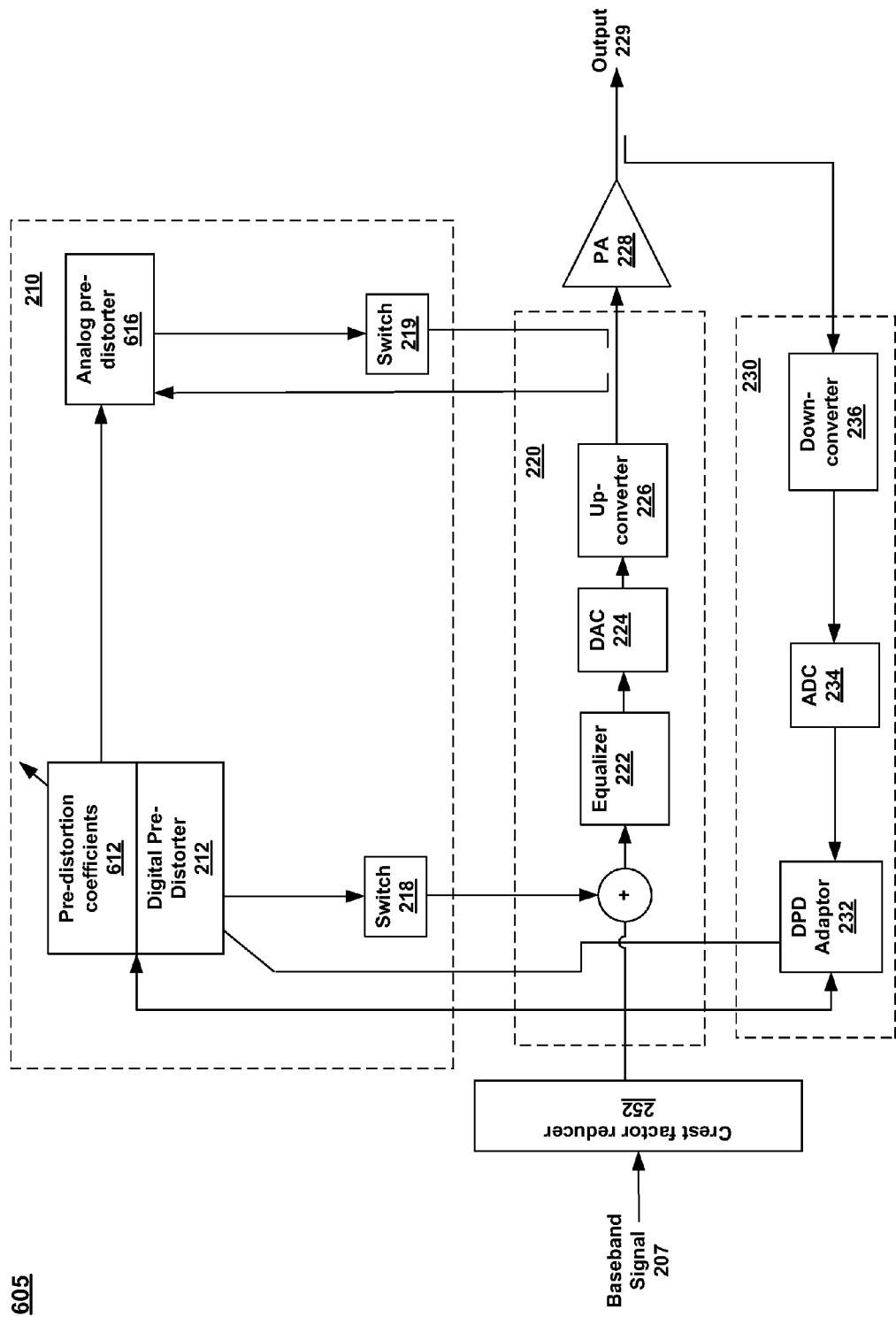

FIG. 6 depicts an embodiment of circuit 605. Circuit 605 is similar to at least circuit 205, as described above. However, digital pre-distortion path 210 includes pre-distortion coefficients 612 and analog pre-distorter 616.

In one embodiment, pre-distortion is performed in the digital domain, for example, by digital pre-distorter 212. In such an embodiment, the pre-distortion is added to the main signal in the main signal path 220 prior to equalizer 222.

In another embodiment, pre-distortion coefficients 612 are sent to analog pre-distorter 616, which is in the analog domain. Accordingly, the pre-distortion is provided in the analog domain. The output (RF or IF signals) of analog pre-distorter 616 is added to main signal path 220, prior to power amplifier 228, via switch 219. In such an embodiment, samples of the main signal are received by analog pre-distorter 616 to facilitate in the pre-distortion in the analog domain.

Additionally, the adaptation is done in the digital domain using the feedback signal and baseband signal 207 (e.g., crest factor reduced or not crest factor reduced).

Figure 7:
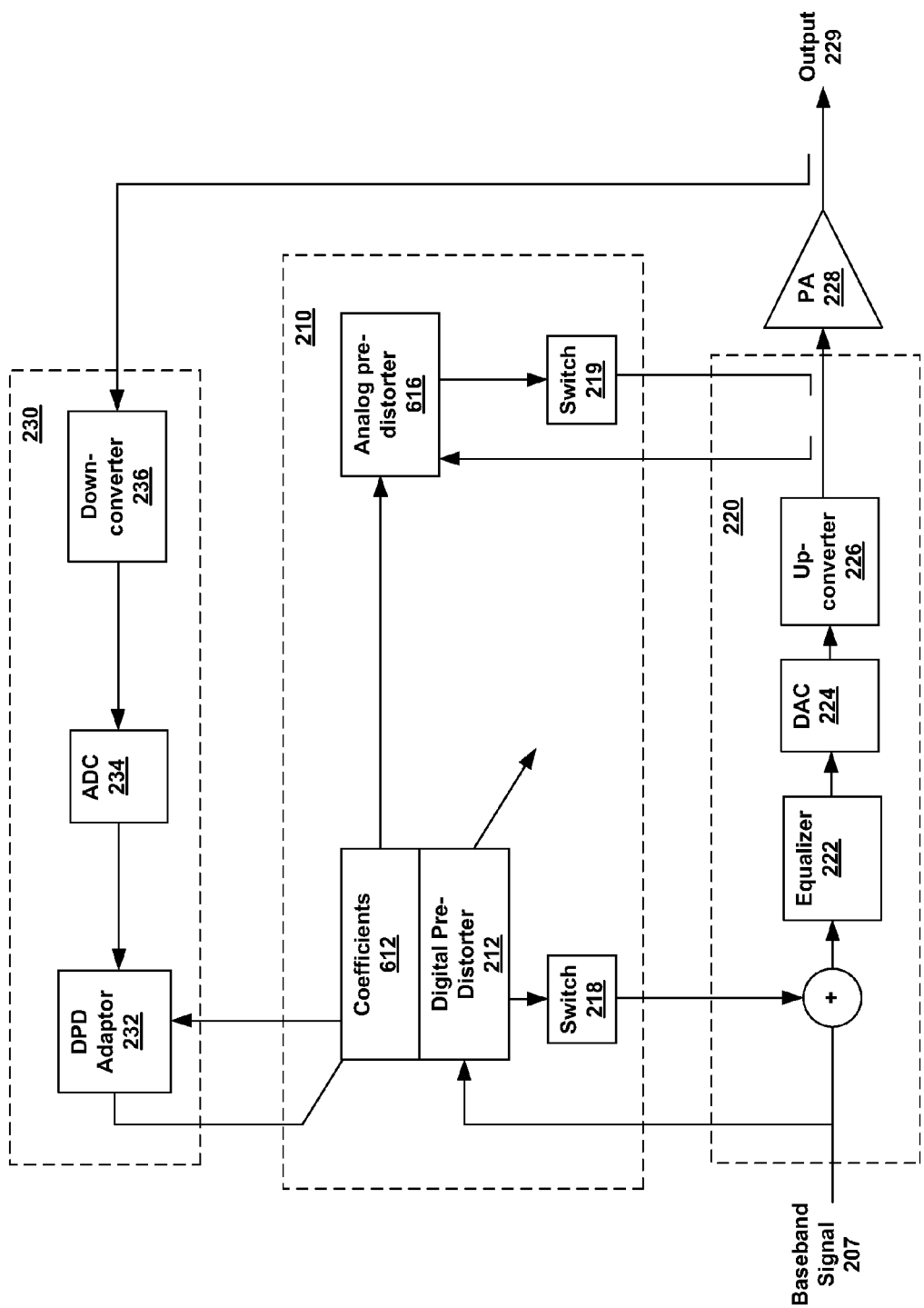

FIG. 7 depicts an embodiment of circuit 705. Circuit 705 is similar to at least circuit 605, as described above.

In one embodiment, pre-distortion is performed in the digital domain, for example, by digital pre-distorter 212. In such an embodiment, the pre-distortion is added to the main signal in the main signal path 220 prior to equalizer 222.

In another embodiment, pre-distortion coefficients 612 are sent to analog pre-distorter 616, which is in the analog domain. Accordingly, the pre-distortion is provided in the analog domain. The output (RF or IF signals) of analog pre-distorter 616 is added to main signal path 220, prior to power amplifier 228, via switch 219. In such an embodiment, samples of the main signal are received by analog pre-distorter 616 to facilitate in the pre-distortion in the analog domain.

However, the adaptation is done in the digital domain using the feedback signal and the pre-distorted signal from digital pre-distorter 212.

Figure 8:
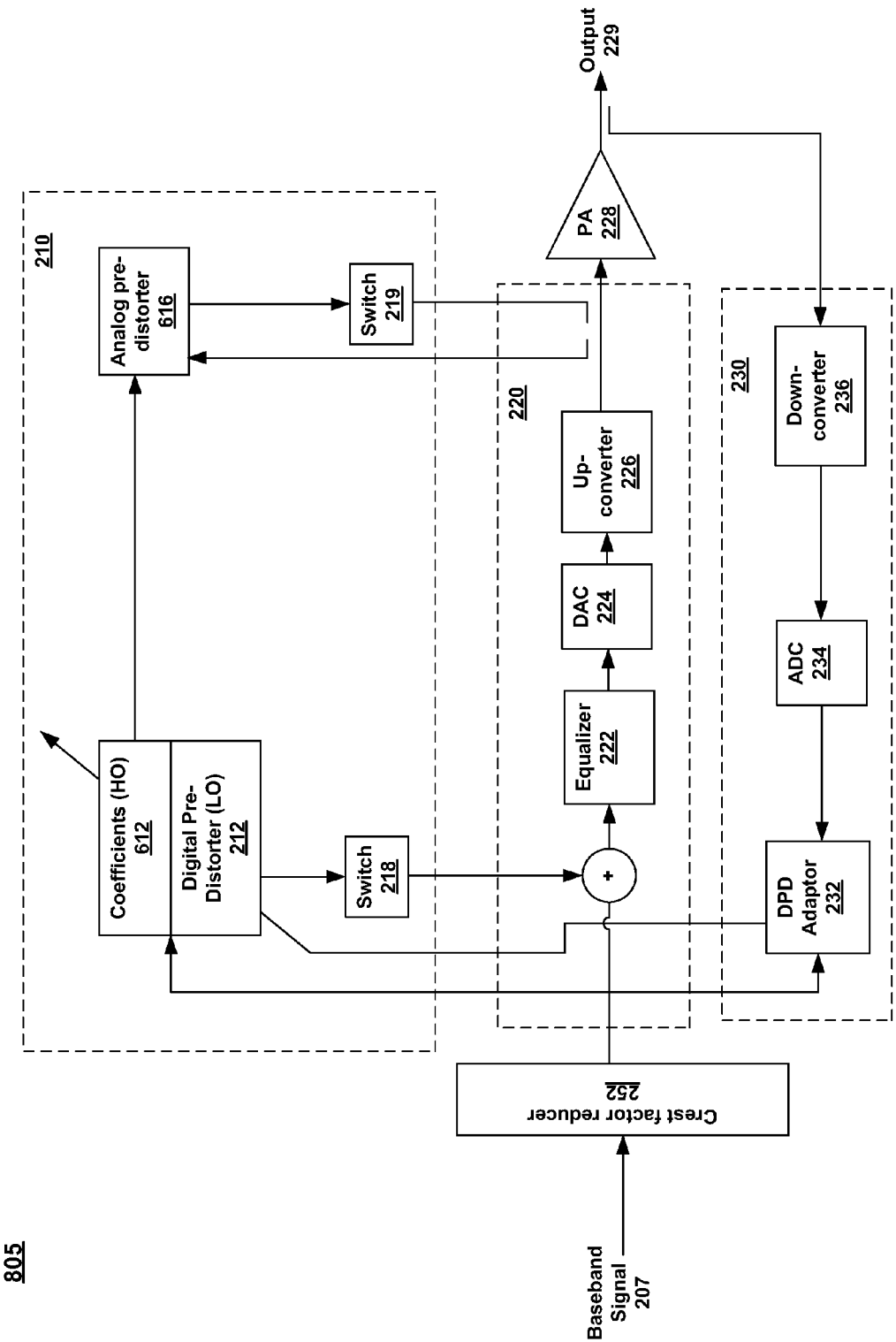

FIG. 8 depicts an embodiment of circuit 805. Circuit 805 is similar to at least circuit 605, as described above.

In one embodiment, pre-distortion is performed in the digital domain, for example, by digital pre-distorter 212. In such an embodiment, the lower order distortion signals are pre-distorted by digital pre-distorter and are then added to the main signal in the main signal path 220 prior to equalizer 222.

In another embodiment, pre-distortion coefficients 612 are sent to analog pre-distorter 616, which is in the analog domain. For example, based on the higher order distortion signals, coefficients 612 are determined and sent to analog pre-distorter 616. In such an embodiment, samples of the main signal are received by analog pre-distorter 616 to facilitate in the pre-distortion in the analog domain.

Additionally, the adaptation is done in the digital domain using the feedback signal and baseband signal 207 (e.g., crest factor reduced or not crest factor reduced).

Figure 9:
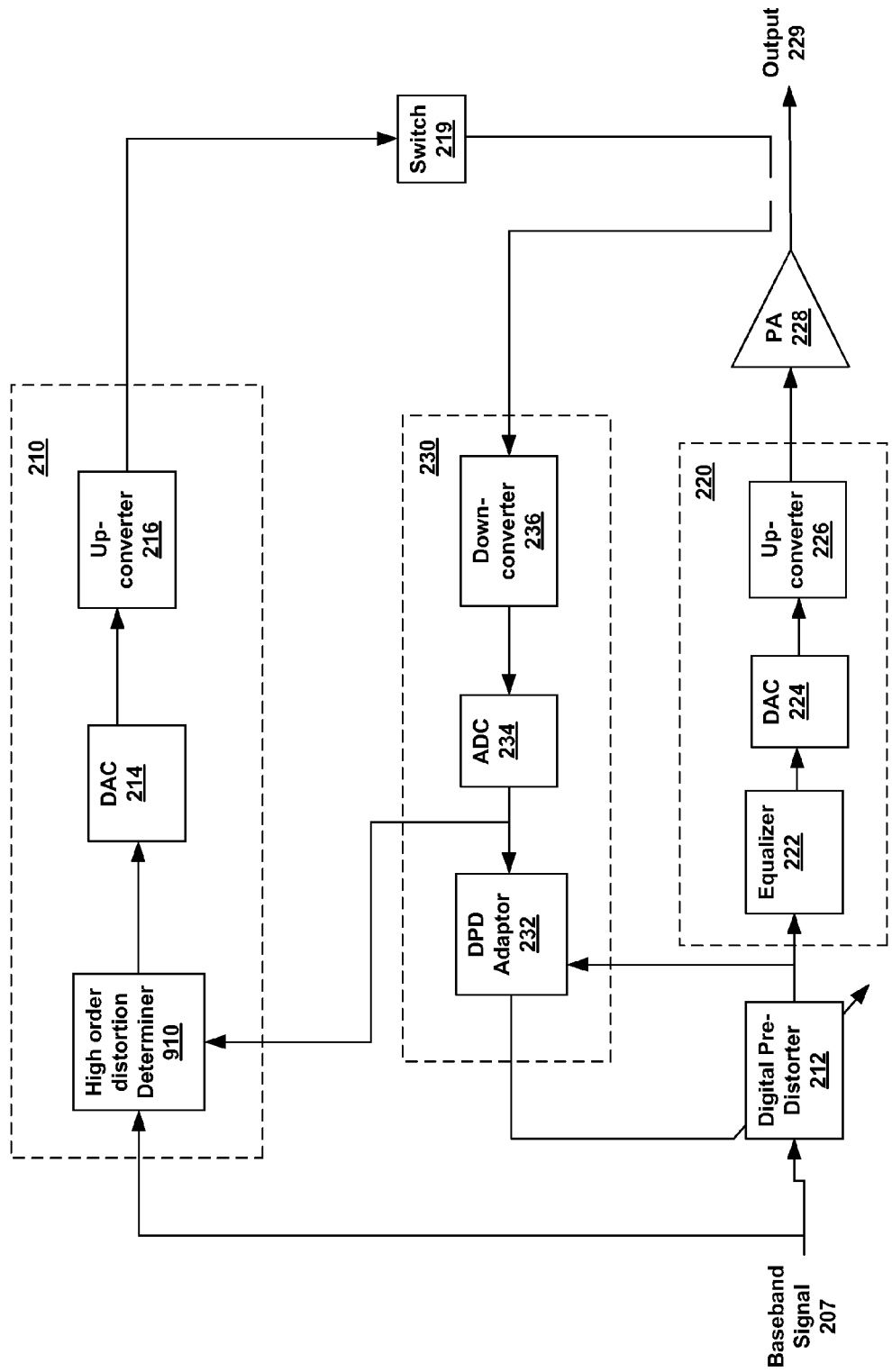

FIG. 9 depicts an embodiment of circuit 905. Circuit 905 has some similar features and functionality as circuit 205, as described above.

Digital pre-distorter 212 performs the digital pre-distortion in the digital domain. The pre-distortion is up-converted to RF or IF frequency, by up-converter 226 before being amplified by power amplifier 228.

In particular, pre-distortion is added to the main signal in the digital domain main. The digital pre-distortion in main signal path 220 takes care of lower order distortions.

High order distortion determiner 910 determines or calculates higher order distortions by subtracting baseband signal 207 at the input of digital pre-distorter 212 from the output of ADC 234. The higher order distortions are then phase and gain adjusted before being up-converted and subtracted from output 229 (i.e., main signal) of power amplifier 228.

Figure 10:
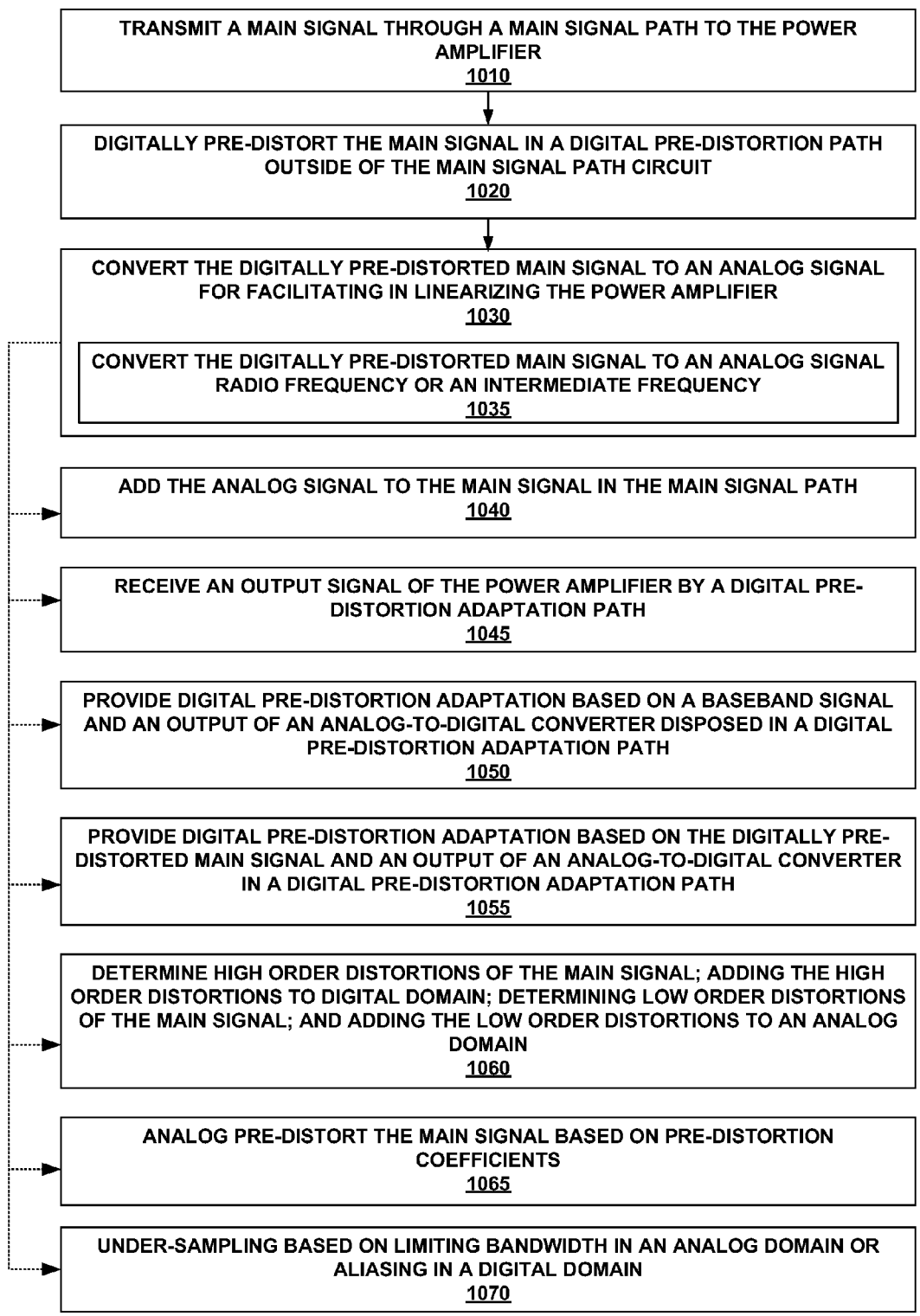
FIG. 10 illustrates an embodiment of a method for linearizing a power amplifier.

FIG. 10 depicts an embodiment of method 1000 for linearizing a power amplifier. In various embodiments, method 1000 is carried out by processors and electrical components under the control of computer readable and computer executable instructions. The computer readable and computer executable instructions reside, for example, in a data storage medium such as computer usable volatile and non-volatile memory. However, the computer readable and computer executable instructions may reside in any type of computer readable storage medium. In some embodiments, method 1000 is performed at least by one of the circuits described herein.

At 1010 of method 1000, a main signal is transmitted through a main signal path to the power amplifier. For example, baseband signal 207 is transmitted through main signal path 220 to power amplifier 228. In particular, baseband signal 207 travels through main signal path 220 without being digitally pre-distorted within the main signal path 220. However, baseband signal 207 is pre-distorted in the analog domain prior to power amplifier 228.

At 1020, the main signal is digitally pre-distorted in a digital pre-distortion path outside of the main signal path circuit. For example, digital pre-distortion path 210 is separate from main signal path 220. As such, baseband signal 207, received by digital pre-distortion path 210, is digitally pre-distorted by digital pre-distorter 212.

At 1030, the digitally pre-distorted main signal is converted to an analog signal for facilitating in linearizing the power amplifier. For example, baseband signal 207 is digitally pre-distorted in the digital domain by digital pre-distorter 212. The digital output of digital pre-distorter 212 is converted into an analog signal by DAC 214. In various embodiment, at 1035, the pre-distorted main signal is converted to an RF or an IF frequency.

At 1040, an analog signal is added to the main signal in the main signal path. For example, the analog pre-distortion signal is added to the main signal in main signal path 220 prior to power amplifier 228.

At 1045, an output signal of the power amplifier is received by a digital pre-distortion adaptation path. For example, output 229 is received by DPAP 230, which is a feedback loop that facilitates in the adaptation of the pre-distortion.

At 1050, digital pre-distortion adaptation is provided based on a baseband signal (e.g., crest factor reduced or not crest factor reduced) and an output of an analog-to-digital converter disposed in a digital pre-distortion adaptation path. For example, digital pre-distortion adaptor 232 receives and compares baseband signal 207 and the output of ADC 234.

At 1055, digital pre-distortion adaptation is provided based on digitally pre-distorted main signal and an output of an analog-to-digital converter in a digital pre-distortion adaptation path. For example, digital pre-distortion adaptor 232 receives and compares output of ADC 234 and the digitally pre-distorted main signal from digital pre-distorter 212.

At 1060, high order distortions of the main signal are determined and added to an analog domain. For example, high order distortion determiner 412 determines the high order distortions of the pre-distorted baseband signal 207 which are then added to the analog domain.

Also, at 1060, low order distortions of the main signal are determined and added to a digital domain. For example, low order distortion determiner 413 determines the low order distortions of pre-distorted baseband signal 207 which are then added to main signal path in the digital domain.

At 1065, the main signal is pre-distorted in the analog domain based on pre-distortion coefficients. For example, baseband signal 207 is pre-distorted based on pre-distortion coefficients 612 which are sent to analog pre-distorter 616.

At 1070, under-sampling is performed based on limiting bandwidth in an analog domain or aliasing in a digital domain. For example, under-sampling is based on limiting the bandwidth in the analog domain or aliasing in the digital domain and occurs at ADC 234 in the feedback or adaptation path.

Various embodiments are thus described. While particular embodiments have been described, it should be appreciated that the embodiments should not be construed as limited by such description, but rather construed according to the following claims. Moreover, various embodiments described herein may be utilized separately or in combination.

The invention claimed is:

1. A circuit for linearizing a power amplifier comprising:
    a main signal path comprising a digital-to-analog converter, wherein a main signal is transmitted through said main signal path to said power amplifier; and
    a digital pre-distortion path disposed outside of said main signal path, wherein said digital pre-distortion path comprises:
        a digital pre-distorter for digitally pre-distorting said main signal; and
        a digital-to-analog converter.

2. The circuit of claim 1, further comprising:
    a digital pre-distortion adaptation path for receiving an output signal of said power amplifier, wherein said digital pre-distortion adaptation path comprises:
        a feedback analog-to-digital converter; and
        a digital pre-distortion adaptor.

3. The circuit of claim 1, wherein an analog output of said digital pre-distortion path is added to said main signal in said main signal path.

4. The circuit of claim 1, wherein said digital pre-distorter is also for obtaining pre-distortion coefficients from a digital pre-distortion adaptor.

5. The circuit of claim 4, wherein said digital pre-distortion path further comprises:
    an analog pre-distorter for analog pre-distortion of said main signal based on said pre-distortion coefficients.

6. The circuit of claim 2, wherein said digital pre-distortion adaptor is for digital pre-distortion adaptation based on a baseband signal and an output of said feedback analog-to-digital converter.

7. The circuit of claim 2, wherein said digital pre-distortion adaptor is for digital pre-distortion adaptation based on an output of said feedback analog-to-digital converter and said digitally pre-distorted main signal.

8. The circuit of claim 1, wherein said digital pre-distorter further comprises:
a high order distortion determiner for determining high order distortions of said main signal, wherein said high order distortions are added to an analog domain; and
a low order distortion determiner for determining low order distortions of said main signal, wherein said low order distortions are added to a digital domain.

9. A circuit for linearizing a power amplifier comprising:
a digital pre-distorter for digitally pre-distorting a main signal;
a main signal path comprising:
a digital-to-analog converter
wherein said digitally pre-distorted main signal is transmitted through said main signal path to a power amplifier; and
a high order distortion determiner for determining high order distortions of said main signal, wherein said high order distortions are subtracted from said main signal at an output of said power amplifier; and
a digital-to-analog converter outside of said main signal path for receiving said high order distortions from said high order distortion determiner.

10. The circuit of claim 9, further comprising:
a digital pre-distortion adaptation path for receiving an attenuated output signal of said power amplifier, wherein said digital pre-distortion adaptation path comprises:
an analog-to-digital converter;
an analog down converter; and
a digital pre-distortion adaptor.

11. A method for linearizing a power amplifier, said method comprising:
transmitting a main signal through a main signal path to said power amplifier;
digitally pre-distorting said main signal in a digital pre-distortion path outside of said main signal path, wherein said digital pre-distortion path comprises a digital-to-analog converter; and
converting said digitally pre-distorted main signal to an analog signal for facilitating in linearizing said power amplifier.

12. The method of claim 11, further comprising:
adding said analog signal to said main signal in said main signal path.

13. The method of claim 11, further comprising:
receiving an output signal of said power amplifier by a digital pre-distortion adaptation path.

14. The method of claim 11, further comprising:
providing digital pre-distortion adaptation based on a baseband signal and an output of an analog-to-digital converter disposed in a digital pre-distortion adaptation path.

15. The method of claim 11, further comprising:
providing digital pre-distortion adaptation based on said digitally pre-distorted main signal and an output of an analog-to-digital converter in a digital pre-distortion adaptation path.

16. The method of claim 11, further comprising
determining high order distortions of said main signal;
adding said high order distortions to an analog domain;
determining low order distortions of said main signal; and
adding said low order distortions to a digital domain.

17. The method of claim 11, further comprising:
analog pre-distorting said main signal based on pre-distortion coefficients.

18. The method of claim 11, wherein said converting said digitally pre-distorted main signal to an analog signal further comprises:
converting said digitally pre-distorted main signal to an analog signal radio frequency or an intermediate frequency.

19. The method of claim 11, further comprising:
under-sampling based on limiting bandwidth in an analog domain or aliasing in a digital domain.

\* \* \* \* \*